US007624313B2

(12) United States Patent
Wickeraad et al.

(10) Patent No.: US 7,624,313 B2
(45) Date of Patent: Nov. 24, 2009

(54) TCAM BIST WITH REDUNDANCY

(75) Inventors: John A. Wickeraad, Granite Bay, CA (US); Jonathan E. Greenlaw, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 669 days.

(21) Appl. No.: 11/092,028

(22) Filed: Mar. 28, 2005

(65) Prior Publication Data

US 2006/0215432 A1    Sep. 28, 2006

(51) Int. Cl.
*G11C 29/00* (2006.01)
*G11C 7/00* (2006.01)

(52) U.S. Cl. .................. 714/710; 714/718; 365/201

(58) Field of Classification Search ............... 714/718, 714/710, 711, 723; 365/200–201
See application file for complete search history.

(56) References Cited

U.S. PATENT DOCUMENTS

| 4,939,694 | A | * | 7/1990 | Eaton et al. | ............... | 365/200 |
| 5,991,902 | A | * | 11/1999 | Yoshida | ............... | 714/710 |
| 5,996,096 | A | * | 11/1999 | Dell et al. | ............... | 714/710 |
| 6,690,595 | B1 | * | 2/2004 | Srinivasan et al. | ............... | 365/49.17 |
| 6,731,526 | B2 | | 5/2004 | Inoue | | |
| 6,747,885 | B2 | | 6/2004 | Park | | |
| 6,751,755 | B1 | * | 6/2004 | Sywyk et al. | ............... | 714/54 |
| 6,807,077 | B2 | | 10/2004 | Noda et al. | | |
| 6,865,701 | B1 | * | 3/2005 | Youngs et al. | ............... | 714/718 |
| 7,002,822 | B2 | * | 2/2006 | Kang et al. | ............... | 365/49.17 |
| 7,017,089 | B1 | * | 3/2006 | Huse | ............... | 714/718 |
| 7,219,276 | B2 | * | 5/2007 | Mantri | ............... | 714/723 |
| 2005/0081093 | A1 | * | 4/2005 | Joly et al. | ............... | 714/8 |

OTHER PUBLICATIONS

"A 143MHz 1.1W 4.5Mb dynamic TCAM with hierarchical searching and shift redundancy architecture" by Noda et al. Solid-State Circuits Conference, 2004. Digest of Technical Papers. ISSCC. 2004 IEEE International Publication Date: Feb. 15-19, 2004 On pp. 208-523 vol. 1 ISSN: 0193-6530 ISBN: 0-7803-8267-6 INSPEC Accession No. 8056842.*
"An ultra high throughput and power efficient TCAM-based IP lookup engine" by Zheng et al. INFOCOM 2004. Twenty-third AnnualJoint Conference of the IEEE Computer and Communications Societies Publication Date: Mar. 7-11, 2004 vol. 3, On pp. 1984-1994 vol. 3 ISSN: 0743-166X ISBN: 0-7803-8355-9 INSPEC Accession No. 8302753.*
"Structured Computer Organization" by Andrew Tannenbaum copyright 1984 Prentice-Hall Inc. Section 1.4 p. 11 lines 10-20.*
Pointer, Wikipedia, the free encyclopedia, [webpages][online]. Retrieved on Feb. 16, 2005. Retrieved from the internet: http://en.wikipedia.org/wiki/Pointer. Total pp. 5.
Datatype, Wikipedia, the free encyclopedia, [webpages] [online]. Retrieved on Feb. 16, 2005. Retrieved from the internet: http://en.wikipedia.org/wiki/Datatype. Total pp. 6.

* cited by examiner

*Primary Examiner*—Cynthia Britt

(57) ABSTRACT

In an embodiment of the invention, a method of providing redundancy in a ternary content addressable memory (TCAM) includes: detecting a defective entry in a ternary content addressable memory (TCAM); marking the defective entry so that the defective entry is visible to a software; and avoiding in using the defective entry. For data that normally would have been written into the defective entry, the data is written into an entry that is subsequent to the defective entry. In another embodiment, the redundancy is provided in a CAM instead of a TCAM.

17 Claims, 6 Drawing Sheets

TCAM BIST WITH REDUNDANCY

TECHNICAL FIELD

Embodiments of the invention relate generally to TCAMs (ternary content addressable memories), and more particularly to a TCAM BIST (built-in self test) with redundancy. Embodiments of the invention can also apply to CAMs (content addressable memories).

BACKGROUND

In an integrated circuit (IC) chip, it is a common current practice to include RAMs (random access memories) on the chip, and large sized RAMs would be implemented with redundant columns and rows. Defects are common in IC chips, and a defect may cause a RAM in the chip to not function properly. If redundancies are not implemented on large sized RAMs, the yield will be very low for the chip parts. The redundant rows and columns for RAMs permit the yield for the chip parts to dramatically increase. For example, redundancies for a chip can increase the yield by as much as approximately 50% or more. Increased yield leads to much lower manufacturing cost for chips. Therefore, it is a common practice to implement redundancies in IC chips.

Defective locations also occur in a TCAM (ternary content addressable memory) and also in CAMs. As known to those skilled in the art, a CAM is a type of memory that provides a mechanism for fast searching of the memory contents. A CAM is externally supplied with data, and searches are made within the contents of the CAM for a match with the externally-supplied input data. The address(es) where a match occurs are output by a comparison logic in the CAM. As also known to those skilled in the art, a TCAM is a form of the CAM that supports the storing of zero (0), one (1), or don't care (X) bits. A TCAM cell (in the TCAM) includes a main RAM cell to store a logic "1" state or a logic "0" state, and a mask RAM cell to store mask data. A comparison result of the externally supplied input data with the data stored in the main RAM cell is masked with the mask data such that the comparison result of the masked data bits does not affect a corresponding match. Therefore, the TCAM offers more flexibility to determine which data bits in a word will be masked and is not used during a compare operation.

The TCAM is presently the dominant type of CAM since the longest-prefix routing is a common requirement in networking products such as, for example, routers. For example, TCAMs are used for address searching by routers in a network. As another example, TCAMs are used for access control lists (ACLs) which are typically used for security applications. As known to those skilled in the art, TCAMs and CAMs may be used in different applications.

Defects in a TCAM can decrease the yield of parts and can increase the part cost. Current methods do not address on solving the negative impact on yield due to defects in TCAMs. Additionally, TCAMs and RAMs differ in attributes and characteristics, and therefore, the particular method of implementing redundancies in a RAM may not be a suitable for a TCAM. It would be desirable to achieve higher yield of parts that may have TCAM defects with the addition of redundancy. It would also be desirable to add redundancy to a TCAM at a much lower cost.

Therefore, the current technology is limited in its capabilities and suffers from at least the above constraints and deficiencies.

SUMMARY OF EMBODIMENTS OF THE INVENTION

In an embodiment of the invention, a method of providing redundancy in a ternary content addressable memory (TCAM) includes: detecting a defective entry in a ternary content addressable memory (TCAM); marking the defective entry so that the defective entry is visible to a software; and avoiding in using the defective entry. For data that normally would have been written into the defective entry, the data is written into the next available non-defective entry. In another embodiment, the redundancy is provided in a CAM instead of a TCAM.

These and other features of an embodiment of the present invention will be readily apparent to persons of ordinary skill in the art upon reading the entirety of this disclosure, which includes the accompanying drawings and claims.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF PREFERRED EMBODIMENTS

In the description herein, numerous specific details are provided, such as examples of components and/or methods, to provide a thorough understanding of embodiments of the invention. One skilled in the relevant art will recognize, however, that an embodiment of the invention can be practiced without one or more of the specific details, or with other apparatus, systems, methods, components, materials, parts, and/or the like. In other instances, well-known structures, materials, or operations are not shown or described in detail to avoid obscuring aspects of embodiments of the invention.

Figure 1:
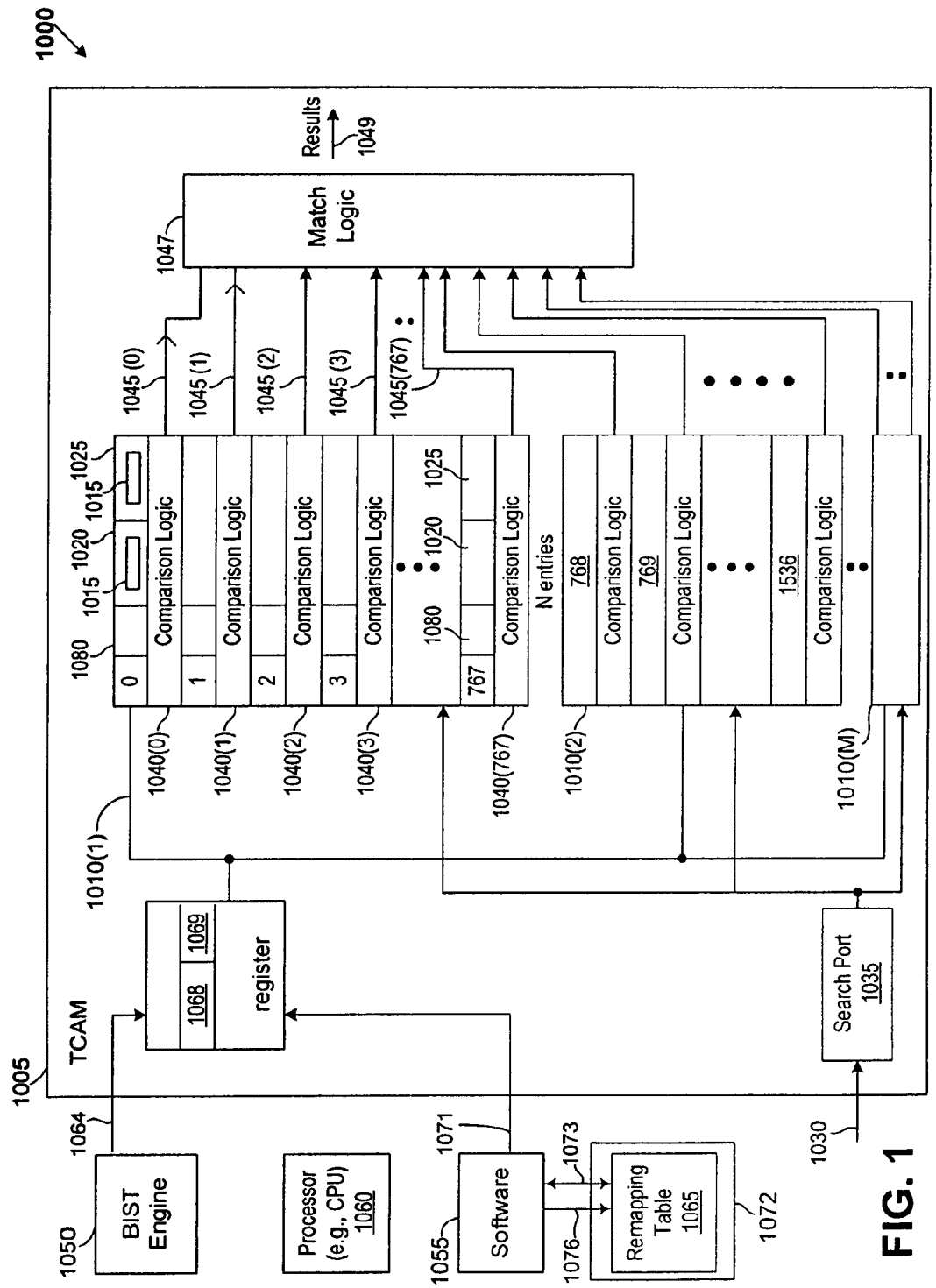
FIG. 1 is a block diagram of an apparatus that includes a TCAM, in accordance with one embodiment of the invention.

FIG. 1 is a block diagram of an apparatus 1000 that includes a TCAM 1005, in accordance with one embodiment of the invention. An embodiment of the invention advantageously permits the yield of TCAM parts to be increased, and this increased yield permits a reduction in manufacturing cost. In another embodiment of the invention, block 1005 is a CAM instead of a TCAM. Therefore, embodiments of the invention are not necessarily limited to TCAMs.

In an embodiment of the invention, the TCAM 1005 may be formed by an M number of TCAM building blocks. The TCAM building blocks are generally referred to as blocks 1010. Therefore, as an example, if M=8, then the TCAM 1005 will be formed by eight (8) TCAM building blocks 1010. However, the value of M may be any suitable integer, and as a result, the number of TCAM building blocks 1010 in the TCAM 1005 may be other values. In the example of FIG. 1, the TCAM building blocks 1010(1), 1010(2), and 1010(M) are shown.

Each TCAM building block 1010 is formed by an array of TCAM cells (bits) which are generally shown as bits 1015. Each TCAM building block 1010 will include an N number of entries, and each entry will include a plurality of TCAM cells 1015. Each TCAM cell stores a ternary value of "0", "1", or "X". As an example, each TCAM building block 1010 is formed with 768 entries (i.e., N=768), although N may be at other values. For example, if N=768, then the TCAM building block 1010(1) will include the entries 0, 1, 2, through 767, while TCAM building block 1010(2) will include the entries 768, 769, 770, through 1536.

Each entry will include a data field 1020 and a mask 1025. Each data in a data field 1020 in an entry is compared with an externally-supplied input data pattern 1030, and the mask 1025 will perform masking of the bits 1015 that are don't cares (X) and a comparison is performed with the other bits 1015 that are not masked. As an example, there are ninety (90) bits in an entry. Therefore, a building block 1010 will have, for example, a size of 768×90.

The input data 1030 in a search command is received by a search port 1035. As an example, the input data 1030 is packet header information (e.g., packet source address or packet destination address) that is parsed by a software 1055 from a data packet received by a network device with the TCAM 1005. The comparison logic (generally, logic 1040 in each entry) can determine each TCAM entry that contains stored data that matches the input data 1030. Typically, each TCAM entry has its own comparison logic. For example, TCAM entry 0 has its own comparison logic 1040(0), while TCAM entry 1 has its own comparison logic 1040(1). The comparison logic 1040 then outputs a match signal via a match line 1045, where a match signal indicates that a TCAM entry contains stored data that matches the input data 1030. Each TCAM entry will have an associated match line 1045. In the example of FIG. 1, the match lines that are shown include lines 1045(0), 1045(1), 1045(3), and other match lines. Each TCAM entry will have an associated match line 1045. A match between the input data pattern 1030 and stored data in each entry is performed for each TCAM building block 1010. The match signal will identify each address of the TCAM entry where a match has occurred. More than one entry can have stored data that matches with the input data 1030. The match lines 1045 are connected to a match logic 1047 which encodes the address of the TCAM entry where a match is first detected. The match logic 1047 generates the result 1049 indicating the matching entry.

A BIST engine 1050 is configured for testing the TCAM 1005. As known to those skilled in the art, BIST (built-in self test) is a technique of designing circuits with additional logic that can be used to test for proper operations of the functional logic of the circuit. The BIST engine 1050 produces various test sequences that test for proper operations of the TCAM 1005. The BIST engine 1050 thoroughly tests all relevant aspects of the TCAM 1005.

The BIST engine 1050 will test every entry in the TCAM 1005, and will test each entry in multiple different manners with the test sequences, in a manner known to those skilled in the art. For example, if the TCAM 1005 has a total of 3,096 entries, then the BIST engine 1050 will check each of the 3,096 entries for matches between input data patterns and stored data and stored masked data, by using various test sequences.

When the BIST test sequences are run for the TCAM entries and if the BIST engine 1050 finds a defective entry in a TCAM building block 1010, then the BIST engine 1050 will set a bit to indicate that the entry is defective and will provide the address of the defective entry to the software 1055 (by use of register or storage area 1067) so that the software 1055 can avoid using the defective TCAM entry, as discussed below in additional detail. As discussed below, in one embodiment of the invention, the BIST engine 1050 will mark the defective TCAM entry by writing 1064 into the register 1067 with the following information: (1) the address of the defective TCAM entry in a data field 1068, and (2) a bit value 1069 associated with the data field 1068 in order to indicate that the TCAM entry is defective. As an example, the bit value 1069 may be in the most significant bit in the data field 1068. However, the bit value 1069 may be in another bit that can be associated with the data field 1068.

Other defective TCAM entries will have their addresses written in other data fields 1068 and have associated bit values 1069 to be set in the register 1067.

Other implementations could also be used to mark and identify a defective TCAM entry in the TCAM 1005. In some embodiments of the invention where multiple defective TCAM entries in a TCAM building block 1010 will be tolerated or permitted, the BIST engine 1050 will write 1064 into the register 1067 with the following information: (1) each identified defective address into the register 1067, and (2) a bit value associated with each defective TCAM entry in order to indicate the defect. The software 1055 can then read 1071 the content of register 1067 and then build 1073 a remapping table 1065 that permits software to avoid using the defective TCAM entries in the TCAM 1005. The software 1055 will input values into the remapping table 1065 based on the content that are read from the register 1067. The remapping table 1065 is a CPU-readable table that permits software to avoid using the defective TCAM entries. Therefore, the software 1055 uses 1076 the remapping table 1065 as a pointer to permit the logical TCAM entries to be remapped to physical TCAM entries, as discussed further below. As an example, the remapping table 1065 is stored in software memory space 1072.

A defective TCAM entry, for example, may have one or more bits 1015 that is stuck at a zero (0) value or at a one (1) value, or may have another type of defect such as, for example, opens or shorts. In other words, an opposite value can not be written into (or read from) a data field 1020 or in a mask 1025 in the defective TCAM entry location. Therefore, the defective TCAM entry results in an erroneous match indication to occur when, in fact, an actual match has not occurred. Alternatively, the defective entry results in an erroneous indication that a match has not occurred, when, in fact, an actual match has occurred.

After a defective entry is found, the defective entry is remembered by the BIST engine 1050. The BIST test sequences are then re-run, and every time that the defective entry is tested, the results are ignored. This procedure ensures that the other locations of the TCAM are working properly.

When the TCAM 1005 is implemented in a computer, a software 1055 can identify the defective entry that is marked by the BIST engine 1050 (in register 1067) by checking 1076 the remapping table 1065. The software 1055 is executed by a central processing unit (CPU) 1060 of the computer. If more than the allowed defective TCAM entries are found in a TCAM building block 1010, then the TCAM 1005 chip will be discarded. For example, if 3 defective entries in a particular TCAM building block 1010 will be allowed or tolerated and if 4 or more defective entries are actually found in the particular TCAM building block 1010, then the TCAM 1005 chip will typically be discarded. However, in this same example, if zero, one, two, or three defective TCAM entries are found in the particular TCAM building block 1010, an embodiment of the invention permits these defective entries (if any) to be tolerated, as discussed below, resulting in increasing the yield of TCAM parts.

A software 1055 will avoid the defective TCAM entry (or defective TCAM entries) by using the remapping table 1065 and will not write data to any marked defective entry.

Each TCAM entry will also have an associated valid bit (generally shown as bits 1080 in FIG. 1) that is set if the TCAM entry is non-defective and has valid data and mask (i.e., the entry is valid to be used in the comparison) and the valid bit is cleared if the TCAM entry is defective or the entry is not in use. If a valid bit 1080 is set, then the associated TCAM entry will be used during compare operations, and the comparison logic 1040 will match the input data 1030 with the contents in the TCAM entry. On the other hand, if a valid bit 1080 is cleared, then the associated TCAM entry will not be used during compare operations, and the comparison logic 1040 will not match the input data 1030 with the contents in the TCAM entry. The BIST engine 1050 or the software 1055 can be configured to set and clear the valid bits 1080.

Figure 2A:
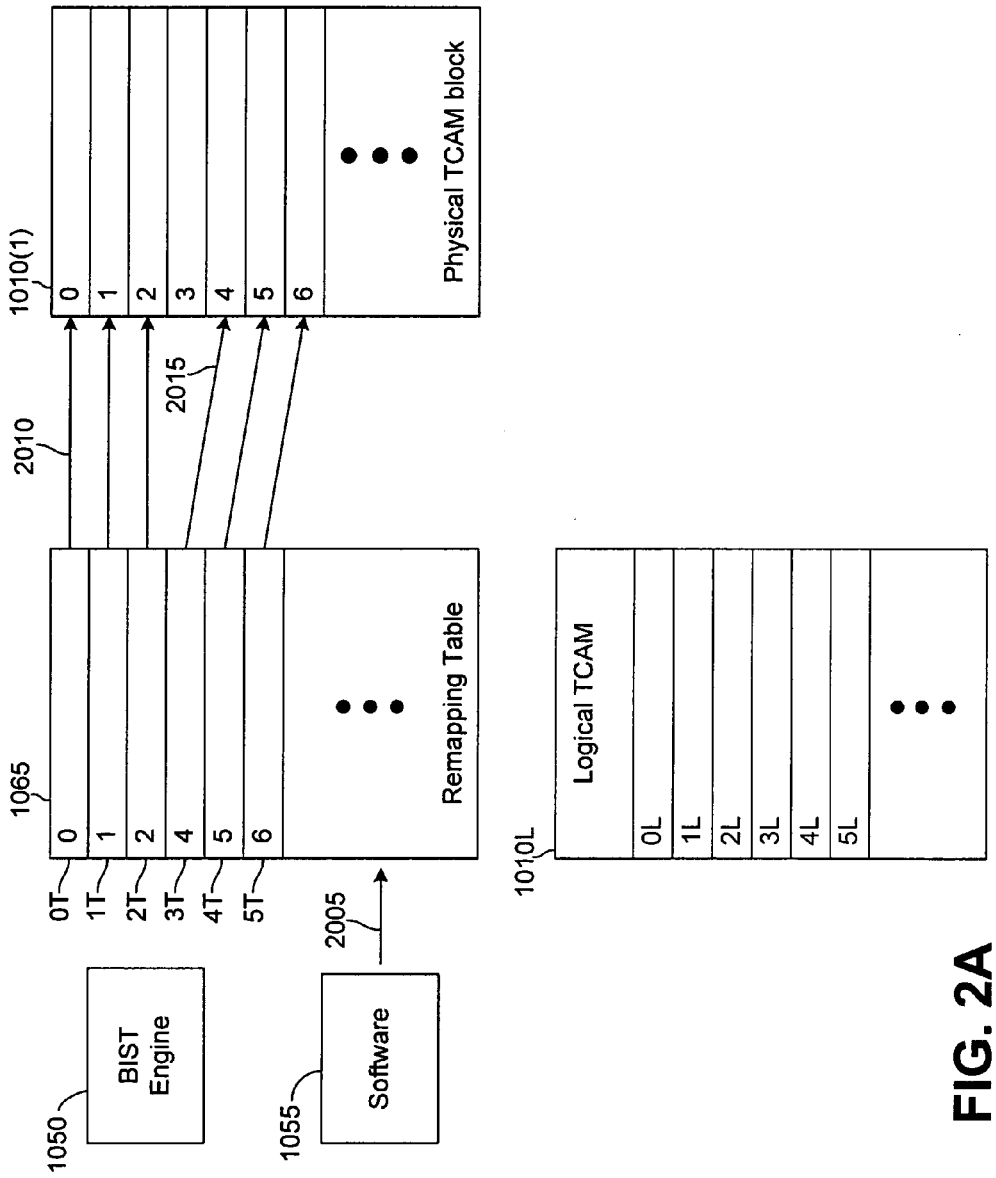
FIG. 2A is a block diagram illustrating additional details of the remapping table and TCAM entries, in accordance with one embodiment of the invention, where a TCAM building block has, for example, one defective entry.

FIG. 2A is a block diagram illustrating additional details of the remapping table 1065 and TCAM entries, in accordance with one embodiment of the invention. As discussed below, the remapping table 1065 permits the logical TCAM entries to be remapped to physical TCAM entries, so that software does not use the defective physical TCAM entries. The logical-to-physical entries remapping algorithm discussed herein is implemented by software as an example. However, the logical-to-physical entries remapping algorithm can alternatively be implemented in hardware. Therefore, embodiments of the invention are not limited to the software-based remapping algorithm that is discussed herein.

Figure 2B:
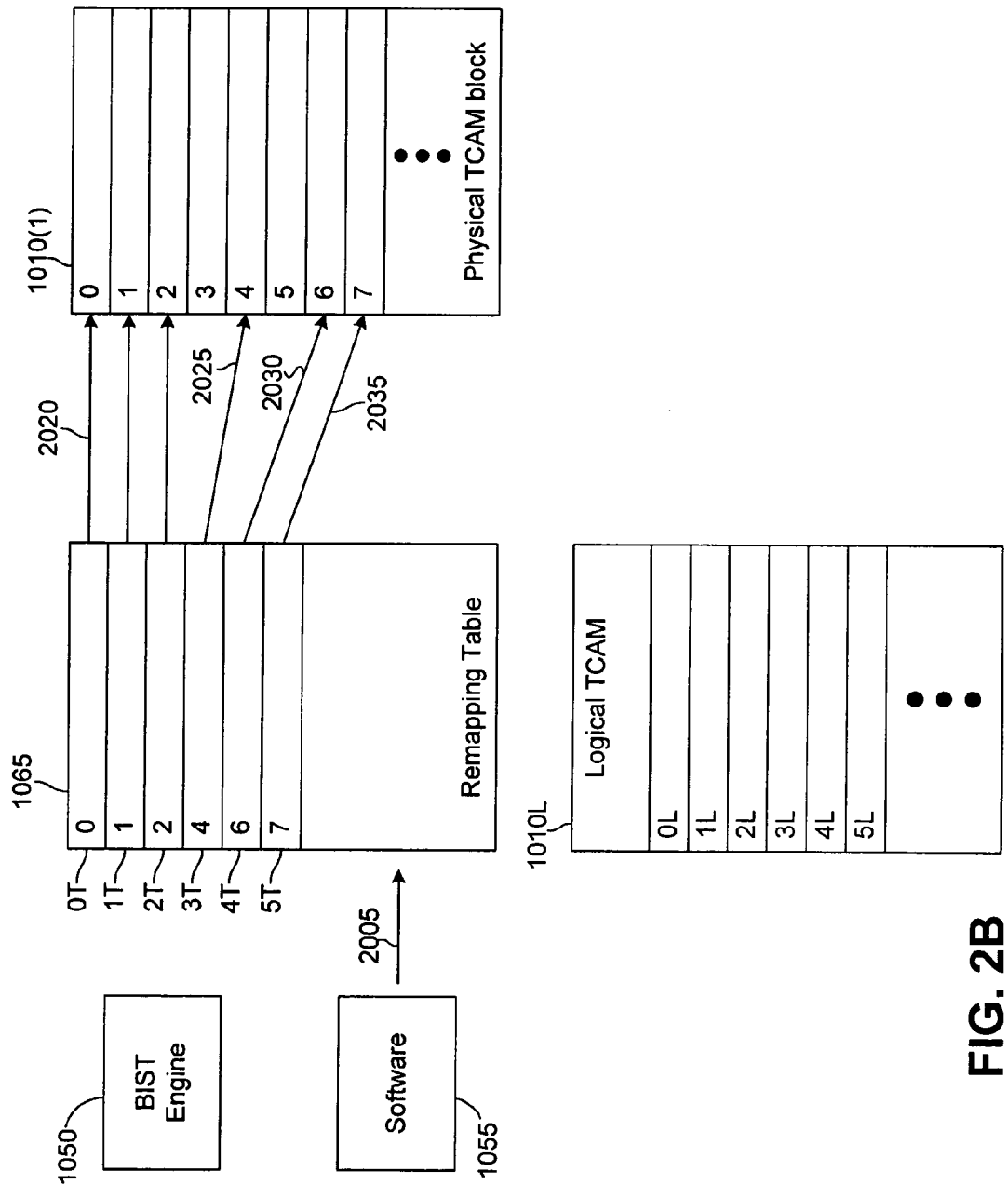
FIG. 2B is a block diagram illustrating additional details of the remapping table and TCAM entries, in accordance with one embodiment of the invention, where a TCAM building block has, for example, multiple defective entries.

In the example of FIG. 2A, a TCAM building block 1010(1) has, for example, one defective physical entry. In the example of FIG. 2B, the TCAM building block 1010(1) has multiple defective physical entries, as discussed further below. The software 1055 will build and read from the remapping table 1065 which allows a logical TCAM entry to point to a non-defective physical TCAM entry (i.e., allows a logical to physical translation of an entry). As a result, any software 1055 will not write into any defective physical entry in the TCAM.

As an example, assume that the physical entry 3 (in TCAM building block 1010(1)) is a defective location in the TCAM 1005. When the software 1005 attempts to write into a logical entry 0L in the logical TCAM 1010L (in memory), the software query 2005 is directed to the table entry 0T which corresponds to the logical entry 0L. The table entry 0T contains the address 0 which will point 2010 the software query 2005 to the physical entry 0 in the TCAM building block 1010(1). Therefore, the software query 2005 accesses the physical entry 0 which is non-defective. Similarly, the table entries 1T and 2T contain the addresses 1 and 2, respectively, that point to corresponding non-defective physical entries in the TCAM building block 1010(1).

On the other hand, when the software 1005 attempts to write into the logical entry 3L in the logical TCAM 1010L, the software query 2005 is directed to the table entry 3T which corresponds to the logical entry 3L. The table entry 3T contains the address 4 which will point 2015 the software query 2005 to the non-defective physical entry 4 in the TCAM building block 1010(1). Therefore, the software query 2005 accesses the non-defective physical entry 4 instead of the defective physical entry 3. In an embodiment of the invention, redundancy is provided in the TCAM 1005 by writing into the non-defective physical entry 4 the data that normally would have been written into the defective physical entry 3. Similarly, data that normally would have been written into the physical entry 4 would now be written into the physical entry 5 which is the next available non-defective entry. Therefore, data that normally would have been written into an entry that is subsequent to the particular defective entry would now be written into an entry that is the next available non-defective entry.

Therefore, the TCAM building block 1010(1) will have one less usable entry, when a defective entry in the TCAM building block 1010(1) is present. However, since the defective entry is not used, the TCAM 1005 is not required to be discarded, resulting in an increased yield of parts and a decrease in part cost. Therefore, an increased in yield is achieve for TCAMs, just as increased yield is achieved for RAMs with redundancy. In particular, the method described herein should only add approximately 1% (or less) in additional overhead (e.g., additional logic) to the area of the TCAM, while providing similar yield improvements in a TCAM, as a column/row redundancy would provide yield improvements in a SRAM. Therefore, an embodiment of the invention achieves higher yield of parts that may have TCAM defects, by effectively adding redundancy to the TCAM. Furthermore, an embodiment of the invention effectively adds redundancy to a TCAM at a much lower cost and overhead.

The software 1055 will build the remapping table 1065 and place the pointers in the appropriate table entries in remapping table 1065, after the BIST test sequence has executed and after the software 1055 has learned about the defective entry addresses by reading 1071 the register 1067. Since the software 1055 places the pointers into the remapping table entries, the software 1055 effectively marks the entries as defective or non-defective, and will avoid using the defective entries by using the remapping table 1065. As known to those skilled in the art, a pointer is a programming language datatype whose value is used to refer to (i.e., "points to") another value that is stored in another location in the computer memory.

If a defect occurs in each of the 8 TCAM building blocks 1010 (when M=8), then there will be total of 8 defective TCAM entries. Each of the 8 defective TCAM entries will be marked as discussed above, so that the 8 defective TCAM entries are not used during the operation of the TCAM. As a result, the TCAM will have 8 fewer entries that are usable for data storage. However, it is not critical to have 8 fewer TCAM entries that are usable in a TCAM 1005. As a result, 8 fewer entries in the TCAM 1005 can typically be tolerated.

On the other hand, as another example, if 3,000 usable entries are desired for the TCAM 1005 and if 8 TCAM building blocks 1010 (M=8) are implemented in the TCAM 1005 and one defective entry per TCAM building block will be tolerated, then the TCAM 1005 can be built with 3,008 total entries. Therefore, if a defective entry in each of the 8 TCAM building blocks 1010 is found, then the desired size of the 3,000 total entries would still be available in the TCAM 1005 because of the 8 extra entries.

Since a defective entry in the TCAM 1005 is marked, the defective entry location (i.e., address) is readable by the CPU 1060 (FIG. 1), so that the CPU 1060 can avoid using the defective entry. Also, a match line for the defective entry is disabled by clearing the valid bit 1080 (FIG. 1) in the defective entry, so that the defective entry does not affect the search results in the TCAM 1005. One method to disable the match line for the defective entry is to clear (write a zero (0) value to) the valid bit 1080 in the defective entry, and the cleared valid bit will force the output of the match line corresponding to the defective entry to be zero (0).

FIG. 2B is a block diagram illustrating additional details of the remapping table 1065 and TCAM entries, in accordance with one embodiment of the invention, where a TCAM building block 1010(1) has, for example, multiple defective entries. Assume that the physical entries 3 and 5, (in TCAM building block 1010(1)) are defective locations in the TCAM 1005, in this example. The table entry 0T contains the address 0 that points 2020 to the corresponding physical entry 0 in the TCAM building block 1010(1). However, when the software 1005 attempts to write into the logical entry 3L in the logical TCAM 1010L, the software query 2005 is directed to the table entry 3T which corresponds to the logical entry 3L. The table entry 3T contains the address 4 which will point 2025 the software query 2005 to the non-defective physical entry 4 in the TCAM building block 1010(1). Therefore, the software query 2005 accesses the non-defective physical entry 4 instead of the defective physical entry 3.

When the software 1005 attempts to write into the logical entry 4L in the logical TCAM 1010L, the software query 2005 is directed to the table entry 4T which corresponds to the logical entry 4L. The table entry 4T contains the address 6 which will point 2030 the software query 2005 to the non-defective physical entry 6 in the TCAM building block 1010(1). Therefore, the software query 2005 accesses the physical entry 6, which is the next available non-defective physical entry.

Similarly, when the software 1005 attempts to write into the logical entry 5L in the logical TCAM 1010L, the table entry 5T will contain the address 7 which will point 2035 the software query 2005 to the non-defective physical entry 7 which is the next available non-defective physical entry.

As noted above, the logical-to-physical entries remapping algorithm can alternatively be implemented in hardware. In a hardware implementation, instead of using a remapping table, comparators may be used to compare an address (indicated in an incoming query) with the defective address (or defective addresses) in the TCAM. Based on the comparison result, the hardware implementation may add the appropriate offset value(s) to the defective address value(s), when necessary, so that the defective address (or defective addresses) are not used. The appropriate offset value(s), if any, would depend on whether one address is defective or multiple addresses are defective in the TCAM and whether the incoming address is less than or equal to or greater than a defective address, as similarly described above with reference FIGS. 2A and 2B.

Figure 3:
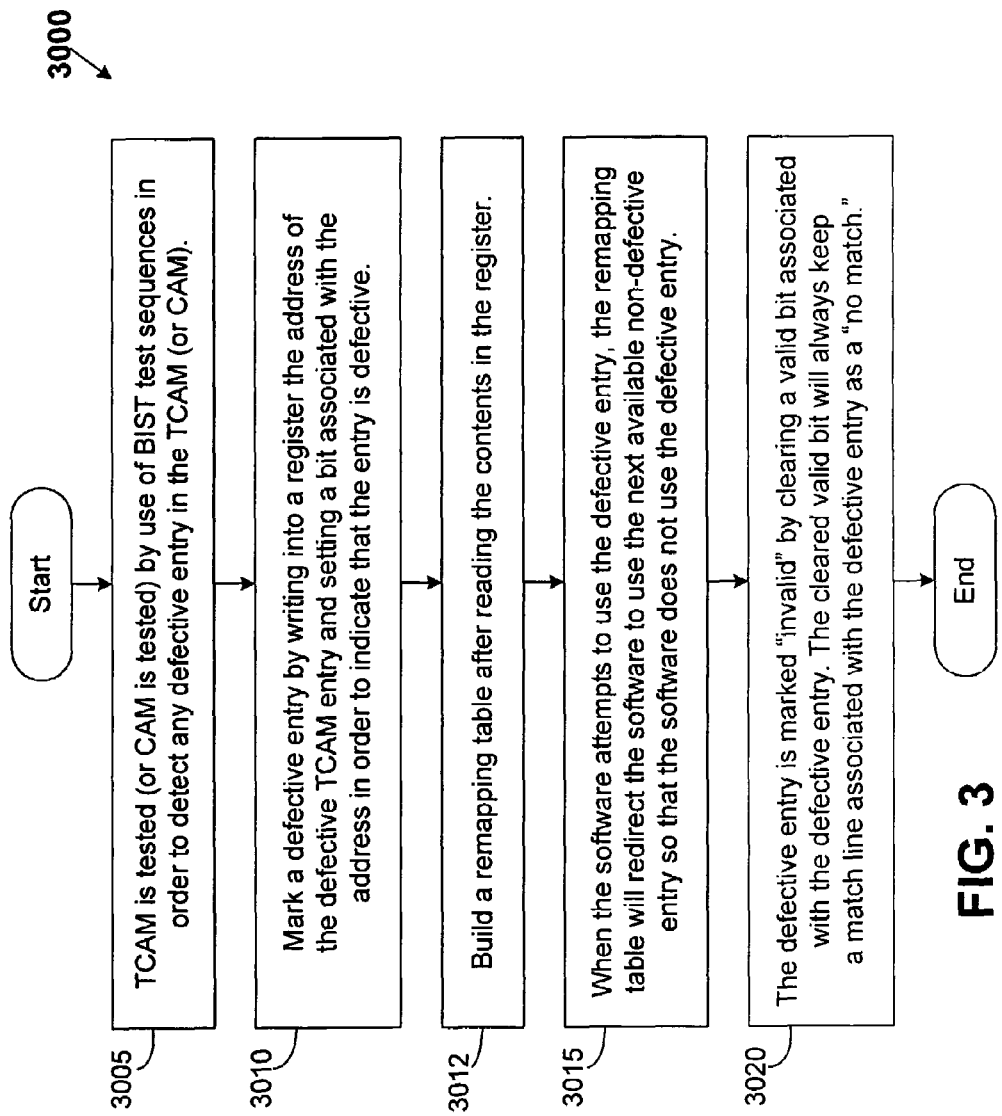
FIG. 3 is a flowchart of a method, in accordance with an embodiment of the invention.

FIG. 3 is a flowchart of a method 3000, in accordance with an embodiment of the invention. In block 3005, a TCAM 1005 (or a CAM) is tested by use of BIST test sequences in order to detect any defective entry in the TCAM.

In block 3010, a defective entry in a TCAM building block 1010 in the TCAM is marked so that the defective entry is visible to software. Defective entries in the other TCAM building blocks 1010 are also marked. In an embodiment of the invention, the BIST engine will mark the defective entry by writing into a register 1067 the address of the defective entry and will set a bit associated with the address in order to indicate that the entry is defective. By permitting the defective entry to be visible to software, the software will detect the defective entry as an invalid address and will not use that defective entry.

In block 3012, a software will build a remapping table after reading the contents in the register.

In block 3015, when the software attempts to use the defective entry (e.g. attempts to write into the defective entry), the remapping table will redirect the software to use the next available non-defective entry so that the software does not use the defective entry. When the software attempts to use other subsequent entries, the remapping table will redirect the software to also use an available non-defective entry.

In block 3020, the defective entry is marked as "invalid" by clearing a valid bit associated with the defective entry. The cleared valid bit will always keep a match line associated with the defective entry as "no match" (i.e., prevent the defective entry from affecting the search results).

Since the defective entry is not used by software, the TCAM will have one less available entry that can be used by software. However, this decrease of one (1) or more in the number of usable entries in the TCAM can be tolerated. All non-defective TCAM addresses in the TCAM will shift by at least one entry from the defective address. This method permits the yield for TCAM parts to increase, as is the case when the yield of parts increases for a RAM that has redundancy.

Figure 4:
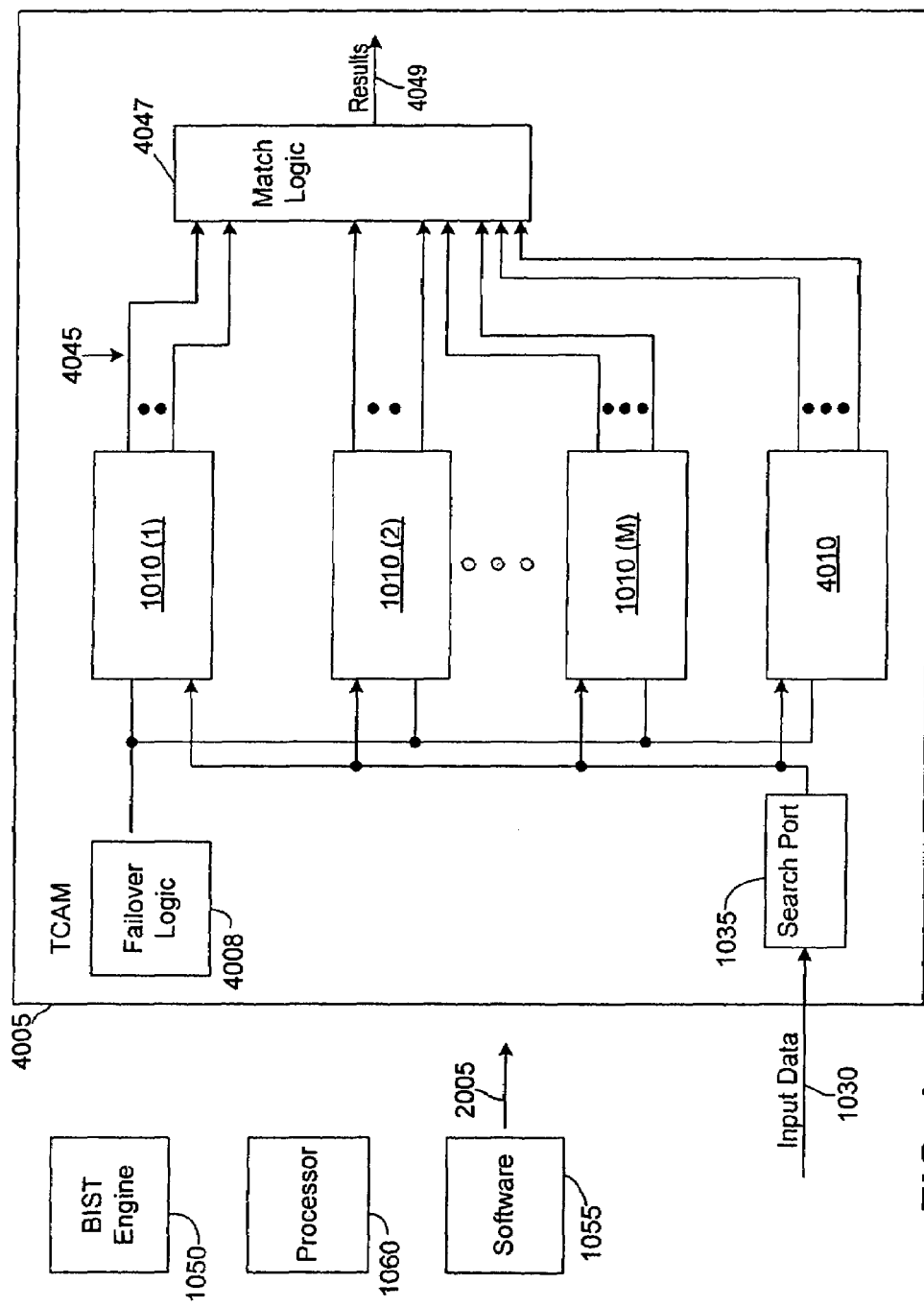
FIG. 4 is a block diagram of an apparatus that includes a TCAM, in accordance with another embodiment of the invention.

FIG. 4 is a block diagram of an apparatus 4000 that includes a TCAM 4005, in accordance with another embodiment of the invention. As similarly mentioned above, in another embodiment of the invention block 4005 is a CAM instead of a TCAM. The TCAM 4005 may be formed by an M number of TCAM building blocks. The TCAM building blocks are generally referred to as blocks 1010 and are shown in FIG. 4 as formed by blocks 1010(1), 1010(2), ... 1010(M). The TCAM 4005 also includes a search port 1035 and each TCAM entry will include a comparison logic, as similarly described above.

In an embodiment of the invention, the TCAM 4005 also includes a failover logic 4008 and a spare TCAM building block 4010. As similarly described above, the BIST engine 1050 is used to determine defective locations in each TCAM building block 1010. If a defective location is determined in one of the TCAM building blocks 1010, then the defective TCAM building block is not used in the TCAM 4005 and the spare TCAM building block is used in place of the defective TCAM building block 1010. For example, assume that the BIST test sequences from the BIST engine 1050 detect the building block 1010(1) as a defective TCAM building block (e.g., the building block 1010(1) has one or more defective entries that can not be tolerated). As a result, the BIST engine 1050 will configure 4015 the failover logic 4008 to redirect the queries 2005 from a software 1055 as follows. The failover logic 4008 will redirect the queries 2005 intended for the defective TCAM building block 1010(1) instead to the spare TCAM building block 4010. As a result, the defective TCAM building block 1010(1) is not used during the operation of the TCAM 4005. Therefore, there is mapping of signals from the software 1055, from a defective TCAM building block to the spare TCAM building block 4010.

In another embodiment of the invention, a plurality of spare blocks 4010 can be included in the TCAM 4005. Therefore, the plurality of spare blocks 4010 permits multiple defective TCAM building blocks 1010 to be tolerated.

In an embodiment of the invention, the failover logic 4008 is typically implemented by use of logic gates such as AND gates, OR gates, buffer components, and other known logic components, so that software queries 2005 are redirected from a defective TCAM building block 1010 to the spare TCAM building block.

The match lines 4045 are connected to a match logic 4047 which encodes the address of the TCAM entry where a match is first detected. The match logic 4047 generates the result 4049 indicating the matching entry. The components in the failover logic 4008 are configured to select the match lines 4045 associated with the spare block 4010 to replace the match lines associated with the defective building block 1010. Therefore, the components in the failover logic 4008 will use the match lines 4045 from the spare block 4010 and will not use the match lines 4045 from the defective building block 1010.

If the spare building block 4010 is 768×90 in size and M=8, then adding the spare building block 4010 in the TCAM 4005 would typically increase the increase the TCAM size by approximately 12.5% plus additional logic in the failover logic 4008 which permits the mapping of the spare TCAM building block 4010 in place of a defective TCAM building block.

Figure 5:
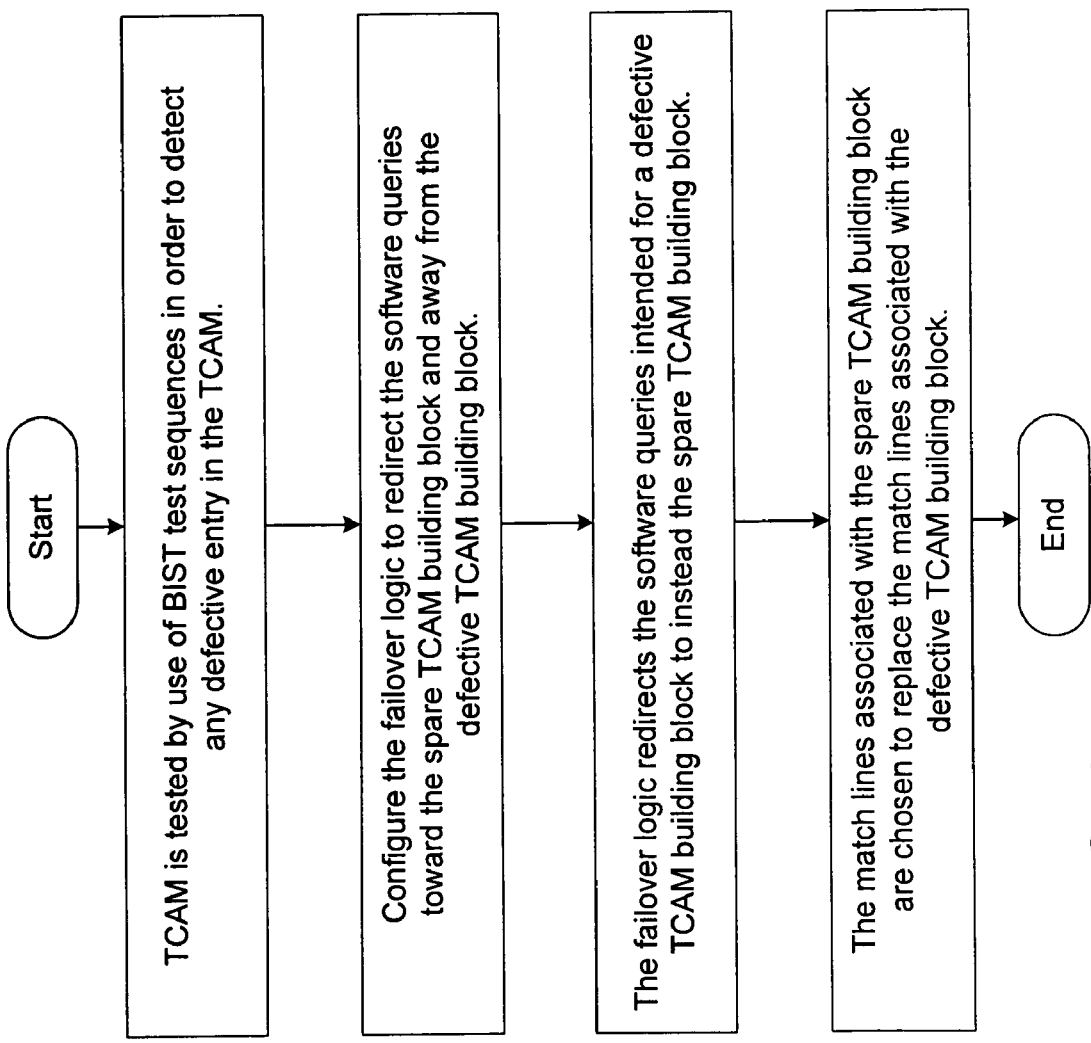
FIG. 5 is a flowchart of a method, in accordance with another embodiment of the invention.

FIG. 5 is a flowchart of a method 5000, in accordance with another embodiment of the invention.

In block 5005, a TCAM 1005 is tested by use of BIST test sequences in order to detect any defective entry in the TCAM.

In block 5010, the BIST engine 1050 will configure the failover logic 4008 to redirect the software queries toward the spare TCAM building block 4010 and away from the defective TCAM building block.

In block 5015, the failover logic 4008 will redirect the software queries intended for a defective TCAM building block instead to the spare TCAM building block 4010. Therefore, the software will not use the defective TCAM building block.

In block 5020, the match lines associated with the spare TCAM building block are chosen to replace the match lines associated with the defective TCAM building block. Therefore, the defective TCAM building block is not usable by the software.

Various elements in the drawings may be implemented in hardware, software, firmware, or a combination thereof.

The various engines or software discussed herein may be, for example, computer software, firmware, commands, data files, programs, code, instructions, or the like, and may also include suitable mechanisms.

Reference throughout this specification to "one embodiment", "an embodiment", or "a specific embodiment" means that a particular feature, structure, or characteristic described in connection with the embodiment is included in at least one embodiment of the invention. Thus, the appearances of the phrases "in one embodiment", "in an embodiment", or "in a specific embodiment" in various places throughout this specification are not necessarily all referring to the same embodiment. Furthermore, the particular features, structures, or characteristics may be combined in any suitable manner in one or more embodiments.

Other variations and modifications of the above-described embodiments and methods are possible in light of the foregoing disclosure. Further, at least some of the components of an embodiment of the invention may be implemented by using a programmed general purpose digital computer, by using application specific integrated circuits, programmable logic devices, or field programmable gate arrays, or by using a network of interconnected components and circuits. Connections may be wired, wireless, and the like.

It will also be appreciated that one or more of the elements depicted in the drawings/figures can also be implemented in a more separated or integrated manner, or even removed or rendered as inoperable in certain cases, as is useful in accordance with a particular application.

It is also within the scope of an embodiment of the present invention to implement a program or code that can be stored in a machine-readable medium to permit a computer to perform any of the methods described above.

Additionally, the signal arrows in the drawings/Figures are considered as exemplary and are not limiting, unless otherwise specifically noted. Furthermore, the term "or" as used in this disclosure is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

It is also noted that the various functions, variables, or other parameters shown in the drawings and discussed in the text have been given particular names for purposes of identification. However, the function names (e.g., BIST engine), variable names, or other parameter names are only provided as some possible examples to identify the functions, variables, or other parameters. Other function names, variable names, or parameter names may be used to identify the functions, variables, or parameters shown in the drawings and discussed in the text.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method of providing redundancy in a ternary content addressable memory (TCAM), the method comprising:
   detecting a defective entry in building block in a ternary content addressable memory (TCAM);
   writing an address of the defective entry into a storage area; and
   setting a bit associated with the address in order to indicate that the entry is defective.

2. The method of claim 1, wherein the building block is formed by an array of TCAM cells.

3. The method of claim 1, wherein the defective entry is detected by use of a built-in self test (BIST) sequence.

4. The method of claim 1, further comprising:
   a software reading the storage area in order to determine the defective entry; and
   the software builds a remapping table that redirects a query that is directed to the defective entry.

5. The method of claim 4, further comprising: the software reading the remapping table and redirecting queries such that the defective entry is not used.

6. The method of claim 4, wherein the remapping table is embedded in hardware.

7. The method of claim 1, wherein the TCAM prevents a software from writing into the defective entry.

8. The method of claim 1, further comprising: for data that normally would have been written into the defective entry, writing the data into a next available non-defective entry.

9. The method of claim 1, wherein more than one defective entry is detected and a software is prevented from using any defective entry.

10. An apparatus for providing redundancy in a ternary content addressable memory (TCAM), the apparatus comprising:
   a ternary content addressable memory (TCAM) comprising at least one building block and at least one storage area,, wherein an address of a defective entry is written into said storage area and a bit associated with the address is set in order to indicate that the entry is defective; and
   a remapping table configures to redirect a query that is directed to the defective entry to another entry.

11. The apparatus of claim 10, wherein the building block is formed by an array of TCAM cells.

12. The apparatus of claim 10, wherein the defective entry is detected by use of a built-in self test (BIST) sequence.

13. The apparatus of claim 10 further comprising a software, wherein the software reads the remapping table to determine where the query should be directed.

14. The apparatus of claim 10, further comprising a hardware that remaps at least some of the entries in the TCAM so that the defective entry is not used.

15. The apparatus of claim 10, wherein a software is prevented from writing into the defective entry.

16. The apparatus of claim 10, wherein for data that normally would have been written into the defective entry, the data is written into an entry that is subsequent to the defective entry.

17. A ternary content addressable memory (TCAM) device comprising:
   at least one building block;
   at least one storage area, wherein an address of a defective entry detected in said at least one building block is written into said at least one storage area; and
   a bit associated with said address, wherein said bit is set in order to indicate that the entry is defective.

* * * * *

UNITED STATES PATENT AND TRADEMARK OFFICE
CERTIFICATE OF CORRECTION

PATENT NO. : 7,624,313 B2  Page 1 of 1
APPLICATION NO. : 11/092028
DATED : November 24, 2009
INVENTOR(S) : John A. Wickeraad et al.

It is certified that error appears in the above-identified patent and that said Letters Patent is hereby corrected as shown below:

In column 10, line 50, in Claim 1, delete "in" and insert -- in a --, therefor.

In column 11, line 16, in Claim 10, delete "area,," and insert -- area, --, therefor.

In column 11, line 20, in Claim 10, delete "configures" and insert -- configured --, therefor.

Signed and Sealed this

Thirteenth Day of July, 2010

David J. Kappos
*Director of the United States Patent and Trademark Office*